United States Patent
Schiffel et al.

(10) Patent No.: US 11,528,799 B2
(45) Date of Patent: Dec. 13, 2022

(54) BACKPLANE AND METHOD FOR PRODUCING SAME

(71) Applicant: Siemens Aktiengesellschaft, Munich (DE)

(72) Inventors: Andre Schiffel, Jahnsdorf (DE); Daniel Sertl, Kastl (DE)

(73) Assignee: Siemens Aktiengesellschaft, Munich (DE)

( * ) Notice: Subject to any disclaimer, the term of this patent is extended or adjusted under 35 U.S.C. 154(b) by 114 days.

(21) Appl. No.: 17/047,792

(22) PCT Filed: Apr. 15, 2019

(86) PCT No.: PCT/EP2019/059622
§ 371 (c)(1),
(2) Date: Oct. 15, 2020

(87) PCT Pub. No.: WO2019/206703
PCT Pub. Date: Oct. 31, 2019

(65) Prior Publication Data
US 2021/0168926 A1    Jun. 3, 2021

(30) Foreign Application Priority Data
Apr. 25, 2018    (EP) ..................................... 18169246

(51) Int. Cl.
*H05K 1/02* (2006.01)
*H05K 3/12* (2006.01)
(Continued)

(52) U.S. Cl.
CPC ......... *H05K 1/0201* (2013.01); *H05K 1/0272* (2013.01); *H05K 3/1275* (2013.01);
(Continued)

(58) Field of Classification Search
CPC ....................... H05K 2201/064; H05K 1/0272
See application file for complete search history.

(56) References Cited

U.S. PATENT DOCUMENTS 6,377,457 B1 * 4/2002 Seshan .............. H01L 23/49822
361/689
2004/0022024 A1    2/2004 Le et al.
(Continued)

FOREIGN PATENT DOCUMENTS

| CN | 101400246 A | 4/2009 |
| CN | 103747658 A | 4/2014 |

(Continued)

OTHER PUBLICATIONS

Chinese Office Action dated Apr. 2, 2021.
(Continued)

*Primary Examiner* — Mukundbhai G Patel
(74) *Attorney, Agent, or Firm* — Harness, Dickey & Pierce, P.L.C.

(57) ABSTRACT

A backplane is for electrically connecting electrical components. An embodiment is directed to the backplane and to a method for producing the same. An embodiment of the backplane includes a carrier plate, conductor tracks, which extend on and/or in the carrier plate, and at least one cooling element arranged on a conductor track for cooling the conductor track.

14 Claims, 5 Drawing Sheets

(51) Int. Cl.
*H05K 3/32* (2006.01)
*H05K 7/14* (2006.01)

(52) U.S. Cl.
CPC ............. *H05K 3/32* (2013.01); *H05K 7/1439* (2013.01); *H05K 2201/064* (2013.01); *H05K 2201/066* (2013.01)

(56) References Cited

U.S. PATENT DOCUMENTS

| | | | |
|---|---|---|---|
| 2004/0195985 A1 | 10/2004 | Hill | |
| 2009/0056979 A1* | 3/2009 | Han | H05K 1/0203 29/829 |
| 2011/0075327 A1 | 3/2011 | Schmid | |
| 2012/0125573 A1* | 5/2012 | Rubenstein | F28D 20/02 165/104.33 |
| 2014/0238640 A1 | 8/2014 | Arvelo et al. | |
| 2016/0120038 A1 | 4/2016 | Gobl et al. | |
| 2017/0325327 A1* | 11/2017 | Smith | H05K 1/021 |
| 2018/0317328 A1 | 11/2018 | Fenker | |

FOREIGN PATENT DOCUMENTS

| | | |
|---|---|---|
| CN | 105283760 A | 1/2016 |
| CN | 105551977 A | 5/2016 |
| CN | 106455455 A | 2/2017 |
| CN | 206640923 U | 11/2017 |
| DE | 10 2016 002 052 A1 | 6/2017 |
| DE | 10 2016 217 236 A1 | 3/2018 |
| EP | 2 111 088 A2 | 10/2009 |
| JP | H03 225889 A | 10/1991 |
| WO | WO 2009141728 A3 | 1/2010 |
| WO | WO 2013020859 A1 | 2/2013 |
| WO | WO 2017125529 A1 | 7/2017 |

OTHER PUBLICATIONS

PCT International Search Report dated Jul. 16, 2019 corresponding to PCT International Application No. PCT/EP2019/059622 filed Apr. 15, 2019.
Written Opinion of International Searching Authority dated Jul. 16, 2019 corresponding to PCT International Application No. PCT/EP2019/059622 filed Apr. 15, 2019.
European Search Report for European Application No. 18169246.8 dated Nov. 2, 2018.
Chinese Office Action dated Sep. 15, 2021.

* cited by examiner

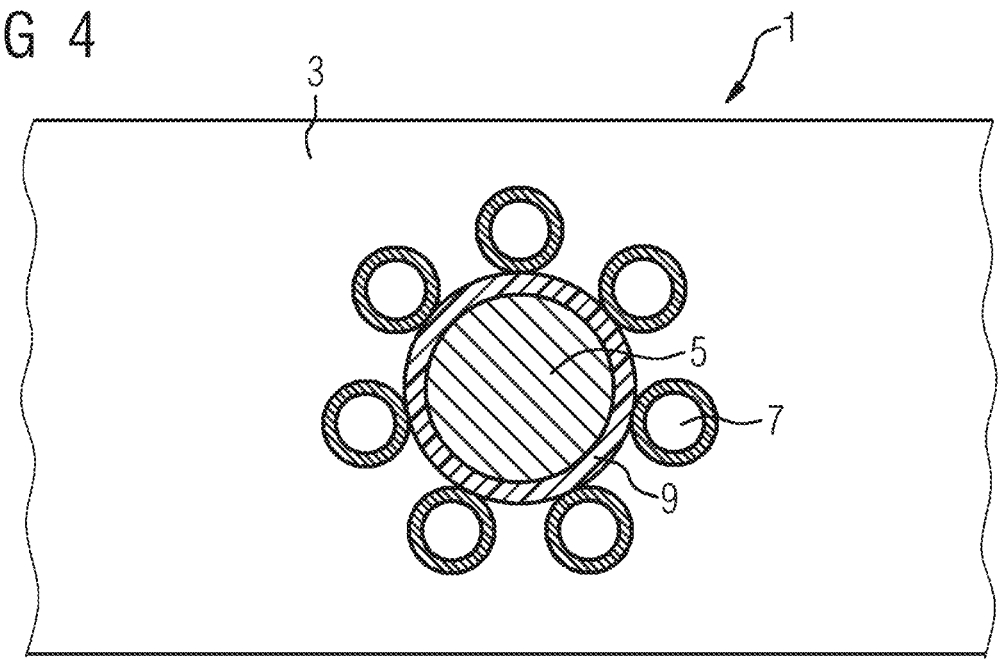
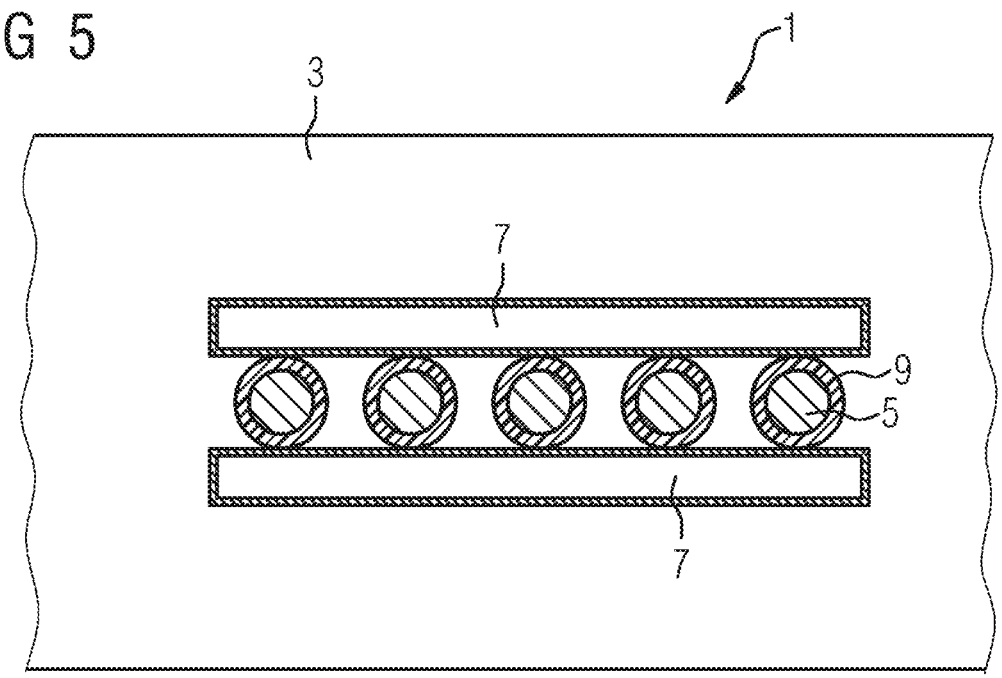

BACKPLANE AND METHOD FOR PRODUCING SAME

PRIORITY STATEMENT

This application is the national phase under 35 U.S.C. § 371 of PCT International Application No. PCTEP2019/059622 which has an International filing date of Apr. 15, 2019, which designated the United States of America and which claims priority to European patent application EP18169246.8 filed Apr. 25, 2018, the contents of each of which are hereby incorporated by reference herein, in their entirety and for all purposes.

FIELD

Embodiments of the invention generally relates to a backplane for electrically connecting electrical components; to a method for producing a backplane of this kind; and to a switch cabinet.

BACKGROUND

Here, a backplane is understood to mean a carrier for electrical components which has conductor tracks for electrically connecting the electrical components. Electrical components of this kind are, for example, low voltage switching devices such as contactors, motor protection switches, motor starters, soft starters or relays, or control units or input/output units. Electrical components of a technical apparatus or system are arranged in a switch cabinet. In conventional switch cabinets, electrical components are generally electrically connected to one another by cables. A multiplicity of electrical components results in a lot of cabling work.

DE 10 2016 002 052 A1 discloses a switch cabinet and a method for producing same. The switch cabinet has at least one control panel with a base plate, on which electrical switching elements are arranged and electrically connected to one another. The at least one base plate and/or at least one of the switching elements is produced by way of a 3D printer in a 3D printing method.

SUMMARY

At least one embodiment of the invention is directed to an improved backplane, a method for producing a backplane and an improved switch cabinet.

Embodiments of the invention are directed to a backplane, a switch cabinet and a method. Advantageous embodiments of the invention are the subject of the claims.

A backplane according to an embodiment of the invention for electrically connecting electrical components comprises a carrier plate, conductor tracks, which each extend on and/or in the carrier plate, and at least one cooling element arranged on a conductor track for cooling the conductor track.

A switch cabinet according to an embodiment of the invention has a backplane according to an embodiment of the invention.

In the method according to an embodiment of the invention for producing a backplane according to an embodiment of the invention, the conductor tracks and the at least one cooling element are manufactured using an additive manufacturing method, for example using 3D printing. For example, the conductor tracks are printed from an electrically conductive paste, in particular, from a copper paste.

According to one embodiment of the method, the carrier plate is manufactured using the additive manufacturing method at least in regions of the conductor tracks and the at least one cooling element.

BRIEF DESCRIPTION OF THE DRAWINGS

The properties, features and advantages of this invention described above and the manner in which these are achieved, will be clearer and more readily understood in connection with the following description of example embodiments which are explained in more detail in connection with the drawings, in which:

FIG. 4 shows a sectional view of a second example embodiment of a backplane, FIG. 5 shows a sectional view of a third example embodiment of a backplane.

Parts corresponding to one another are provided with the same reference characters in the figures

DETAILED DESCRIPTION OF THE EXAMPLE EMBODIMENTS

Figure 1:
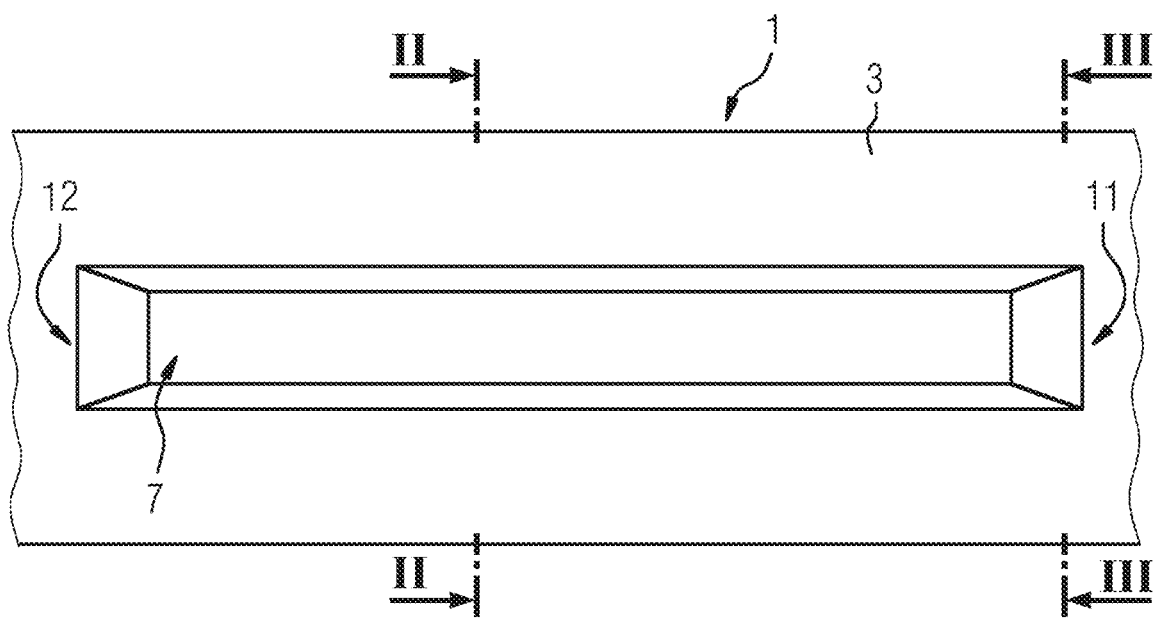
FIG. 1 shows a top view of a first example embodiment of a backplane in the region of a conductor track on which a cooling channel is arranged.

A backplane according to an embodiment of the invention for electrically connecting electrical components comprises a carrier plate, conductor tracks, which each extend on and/or in the carrier plate, and at least one cooling element arranged on a conductor track for cooling the conductor track.

In addition to conductor tracks, a backplane according to an embodiment of the invention therefore also has at least one cooling element for cooling a conductor track. This is advantageous in particular if the conductor tracks are manufactured by way of an additive manufacturing method according to the invention, for example, by way of 3D printing, as conductor tracks manufactured in this way have a lower electrical conductivity than conventional copper lines, as a result of which greater heat development occurs, which can necessitate cooling of conductor tracks to prevent overheating of the conductor tracks and the backplane.

According to one embodiment of the invention, at least one cooling element is a cooling channel for conducting a cooling fluid. Some of the heat loss can be absorbed by the cooling fluid and dissipated from a conductor track to lower the temperature of the conductor track. The cooling fluid is a cooling liquid, for example, a coolant, or a cooling gas, for example air. In particular, the cooling fluid can be a Phase Change Material (=PCM); in this case, the cooling element can be designed as a phase change cooler.

Developments of the aforementioned embodiment of the invention provide that at least one cooling channel surrounds a conductor track at least partially, and/or that at least one cooling channel is wound around a conductor track, and/or that at least one cooling channel has a main channel and secondary channels branching off from the main channel which, for example, extend in a ring-like or finger-like manner around a conductor track. Cooling channels designed in this way advantageously have large contact surfaces which are in thermal contact with a conductor track and are therefore particularly suitable for absorbing and dissipating heat loss from the conductor track.

Furthermore, at least one cooling channel can have at least two interconnected sub-channels through which the cooling fluid can flow in opposite directions. As a result, a cooling circuit can be implemented around a conductor track.

Moreover, at least one cooling channel can be arranged on a plurality of conductor tracks. As a result, one cooling channel can be used for cooling a plurality of conductor tracks. Furthermore, the cooling channel structure can be simplified for only one conductor track in each case in comparison to many individual cooling channels.

According to another embodiment of the invention, at least one cooling element is a finned heat sink with cooling fins. This enables the dissipation of heat loss from a conductor track by convection, the cooling fins advantageously realizing a large cooling surface for dissipating the heat.

According to another embodiment of the invention, a surface of at least one conductor track is at least partially coated with an electrically insulating insulation layer. This is advantageous in particular if a cooling element made of an electrically conductive material is arranged on the conductor track to prevent electrical contact of the conductor track with the walls of the cooling channel.

A switch cabinet according to an embodiment of the invention has a backplane according to an embodiment of the invention.

The use of a backplane according to an embodiment of the invention in a switch cabinet advantageously reduces the effort and the costs for electrically connecting electrical components in the switch cabinet compared to the conventional connection of electrical components by way of cables. Furthermore, the integration of at least one cooling element into the backplane has the advantages already mentioned above of dissipating heat loss from conductor tracks to prevent overheating of the conductor tracks and the backplane.

In the method according to an embodiment of the invention for producing a backplane according to an embodiment of the invention, the conductor tracks and the at least one cooling element are manufactured using an additive manufacturing method, for example using 3D printing. For example, the conductor tracks are printed from an electrically conductive paste, in particular, from a copper paste. According to one embodiment of the method, the carrier plate is manufactured using the additive manufacturing method at least in regions of the conductor tracks and the at least one cooling element.

3D printing is understood to mean a method in which a three-dimensional object is produced by way of a computer-controlled layer-by-layer application of material.

The aforementioned embodiment of the invention takes into account that different configurations of components to be electrically connected also require different cross-sections and profiles of the conductor tracks. For example, thicker conductor tracks are required for power lines than for signal lines, and different arrangements of the components require different profiles of the conductor tracks. The production of the conductor tracks and the at least one cooling element using an additive manufacturing method such as 3D printing enables the cross-sections and the profiles of the conductor tracks and the formation of the at least one cooling element to be easily and flexibly adapted to the configuration of the components to be electrically connected. Production also of the carrier plate at least in the regions of the conductor tracks and of the at least one cooling element using the additive manufacturing method is advantageous in particular if conductor tracks extend in the carrier plate as these conductor tracks and cooling elements arranged on them can then be manufactured together with the regions of the carrier plate surrounding them.

Figure 2:
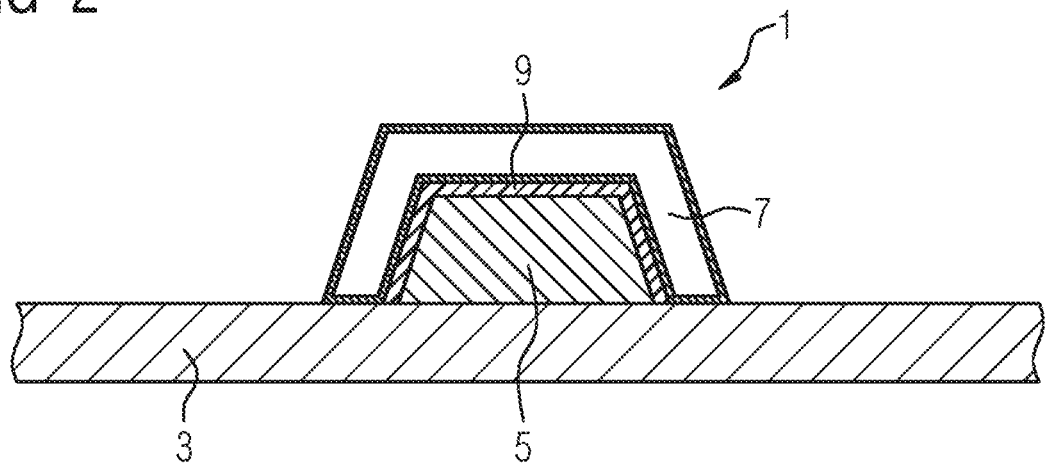
FIG. 2 shows a first sectional view of the first example embodiment of a backplane.
Figure 3:
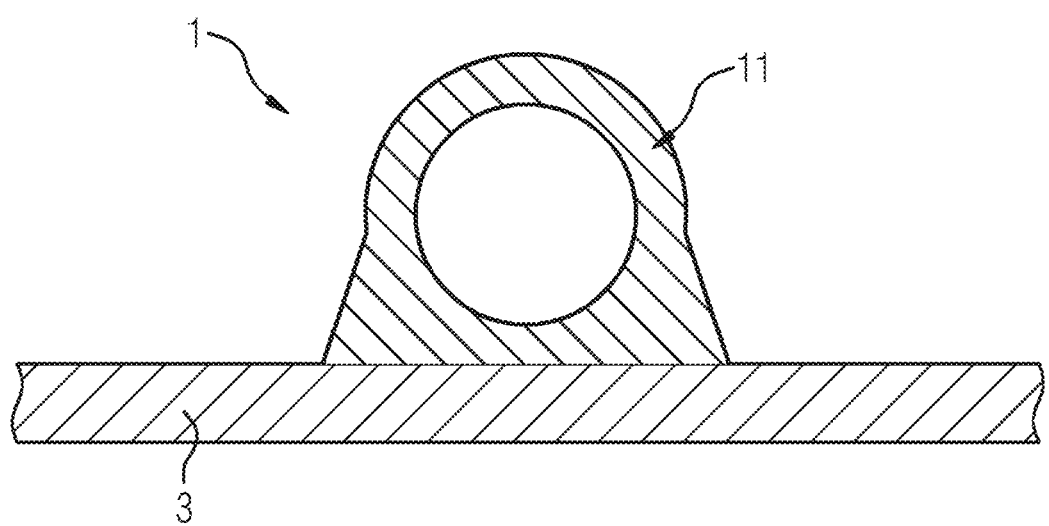
FIG. 3 shows a second sectional view of the first example embodiment of a backplane.

FIGS. 1 to 3 show a first example embodiment of a backplane 1. The backplane 1 has a carrier plate 3 and a conductor track 5 arranged on the carrier plate 3, on which a cooling channel 7 is arranged. FIG. 1 shows a top view of the backplane 1 in the region of the conductor track 5 and FIGS. 2 and 3 each show a sectional view of the backplane 1 with mutually different sectional planes. FIG. 2 shows a sectional view in a central region of the conductor track 5 and FIG. 3 shows a sectional view in an end region of the cooling channel 7.

The conductor track 5 is arranged on a surface of the carrier plate 3. The surfaces of the conductor track 5 which are not in contact with the carrier plate 3 are coated with an insulation layer 9. The cooling channel 7 surrounds the insulation layer 9 and is designed for conducting a cooling fluid to cool the conductor track 5. The cooling fluid is a cooling liquid, for example, a coolant, or a cooling gas, for example air. Each end region of the cooling channel 7 has a cooling fluid connection 11, 12. Cooling fluid is introduced into the cooling channel 7 through a first cooling fluid connection 11, and cooling fluid is discharged from the cooling channel 7 through the second cooling fluid connection 12.

FIG. 4 shows a sectional view of a second example embodiment of a backplane 1. The backplane 1 has a carrier plate 3 and a conductor track 5 arranged in the carrier plate 3. The conductor track 5 is coated with an insulation layer 9. A plurality of cooling channels 7 are arranged on the insulation layer 9, which extend parallel to the conductor track 5 in the carrier plate 3 and are designed to conduct a cooling fluid. The cooling fluid is a cooling liquid, for example, coolant, or a cooling gas, for example air. The end regions of the cooling channels 7 can each have a cooling fluid connection 11, 12 analogously to the example embodiment described with reference to FIGS. 1 to 3. Several or all of the cooling channels 7 may also have a common cooling fluid connection 11, 12. Alternatively, only one end region of each cooling channel 7 can have a cooling fluid connection 11, 12 and the other end regions of the cooling channels 7 can be connected to one another so that the cooling channels 7 form a cooling fluid circuit in which the cooling fluid flows through some of the cooling channels 7 in a first flow direction and through the other cooling channels 7 in a second flow direction opposite to the first flow direction.

FIG. 5 shows a sectional view of a third example embodiment of a backplane 1. The backplane 1 has a carrier plate 3 and plurality of conductor tracks 5 arranged in the carrier plate 3. Each conductor track 5 is coated with an insulation layer 9. On the insulation layers 9, in each case one cooling channel 7 is arranged in the carrier plate 3 on two opposite sides of the conductor tracks 5, which cooling channel extends along all the conductor tracks 5 and is designed to conduct a cooling fluid. The cooling fluid is a cooling liquid, for example, coolant, or a cooling gas, for example air. The end regions of the cooling channels 7 can each have a cooling fluid connection 11, 12 analogously to the example embodiment described with reference to FIGS. 1 to 3. Alternatively, only one end region of each cooling channel 7 can have a cooling fluid connection 11, 12 and the other two end regions of the cooling channels 7 can be connected to one another so that the cooling channels 7 form a cooling fluid circuit in which the cooling fluid flows through a cooling channel 7 in a first flow direction and through the other cooling channel 7 in a second flow direction opposite to the first flow direction.

In the example embodiments shown in FIGS. 1 to 5, the conductor tracks 5 are each manufactured from an electrically conductive material, for example, from copper. The insulation layers 9 are each manufactured from an electrically insulating material, for example, from an insulating varnish, and insulate the conductor tracks 5 with respect to the walls of the cooling channels 7. The walls of the cooling channels 7 are manufactured from an electrically conductive material, for example, from a metallic material. In alternative example embodiments, however, the walls of the cooling channels 7 can be manufactured from electrically insulating material; in these cases, the insulation layers 9 between the conductor tracks 5 and the walls of the cooling channels 7 can be omitted.

In the example embodiments shown in FIGS. 4 and 5, the walls of the cooling channels 7 can be made of a different material than the carrier plate 3. Alternatively, the cooling channels 7 can be designed as recesses in the carrier plate 3.

Figure 6:
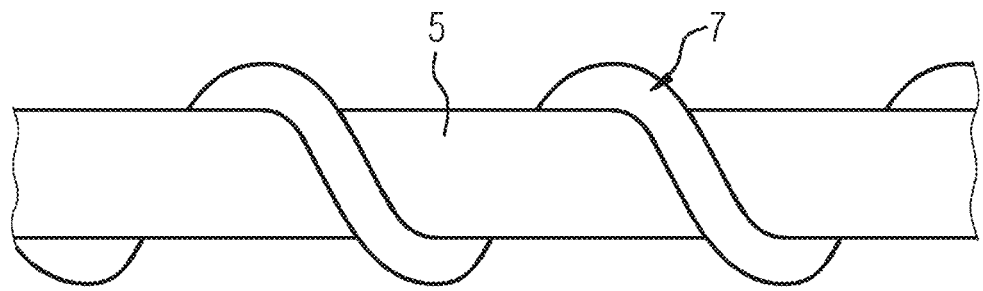
FIG. 6 shows a cooling channel which runs helically around a conductor track.
Figure 7:
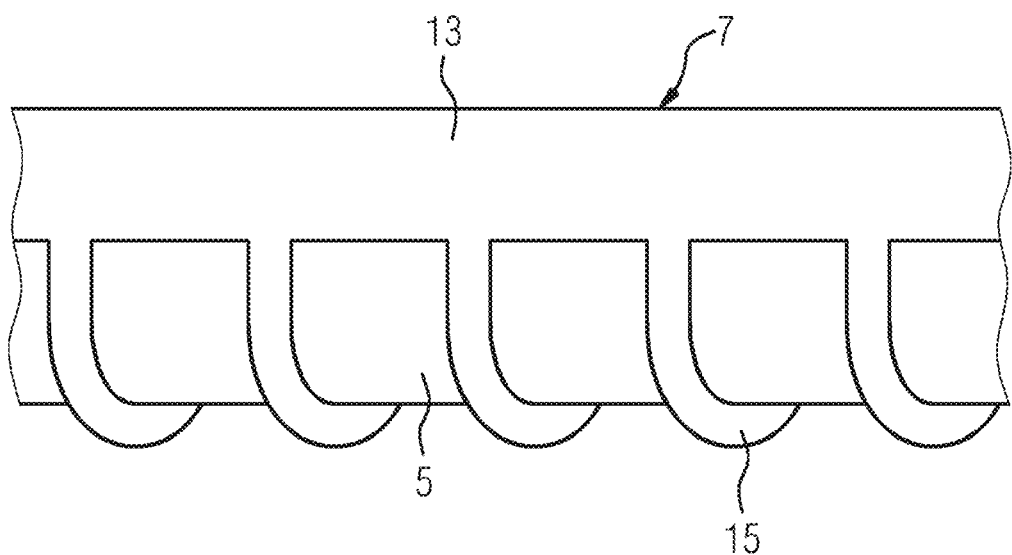
FIG. 7 shows a cooling channel with a main channel and a plurality of secondary channels which extend around a conductor track in a ring-like or finger-like manner.

FIGS. 6 and 7 show further example embodiments of in each case one conductor track 5, on which in each case one cooling channel 7 is arranged. FIG. 6 shows a cooling channel 7 which extends helically around a conductor track 5. FIG. 7 shows a cooling channel 7 with a main channel 13 which extends along a conductor track 5, and a plurality of secondary channels 15 branching off from the main channel 13, each of which extends around the conductor track 5 in a ring-like or finger-like manner. The conductor tracks 5 and cooling channels 7 shown in FIGS. 6 and 7 are in each case arranged on or in a carrier plate 3 of a backplane 1 analogously to the example embodiments shown in FIGS. 1 to 5. As in these example embodiments, the conductor track 5 can be coated with an insulation layer 9 in each case.

Figure 8:
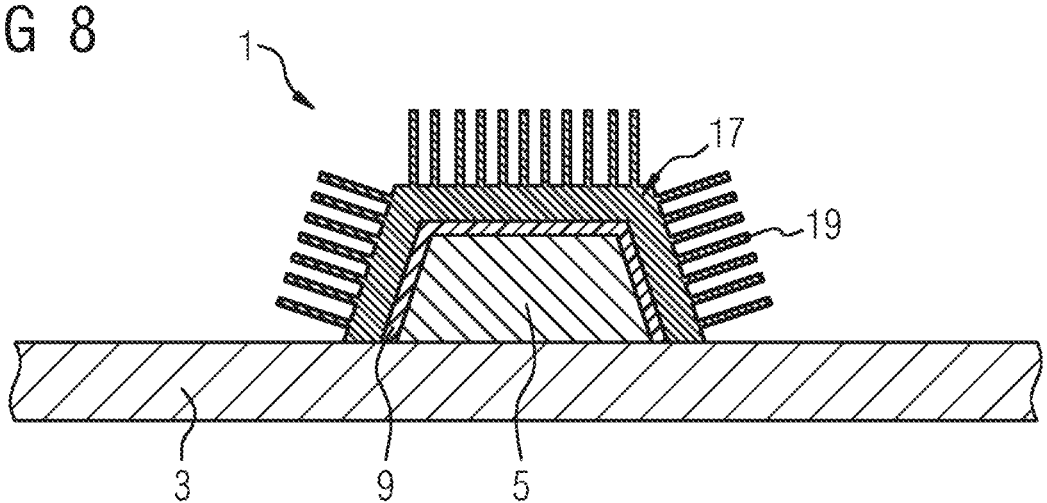
FIG. 8 shows a sectional view of a fourth example embodiment of a backplane.

FIG. 8 shows a sectional view of a fourth example embodiment of a backplane 1 analogously to FIG. 2. Like the example embodiment shown in FIGS. 1 to 3, the backplane 1 has a carrier plate 3 and a conductor track 5 arranged on a surface of the carrier plate 3. The surfaces of the conductor track 5 not in contact with the carrier plate 3 are coated with an insulation layer 9. A finned heat sink 17 with outwardly projecting cooling fins 19 for cooling the conductor track 5 by way of convection or by an air flow generated, for example, by a fan, is arranged on the insulation layer 9. The conductor track 5 is manufactured from an electrically conductive material, for example, from copper. The insulation layer 9 is manufactured from an electrically insulating material, for example, from an insulating varnish. The finned heat sink 17 is manufactured from an electrically conductive material, for example, from a metallic material, and is electrically insulated from the conductor track 5 by the insulation layer 9.

In all the example embodiments described with reference to FIGS. 1 to 8, the conductor tracks 5, the insulation layers 9 and the cooling channels 7 or the finned heat sink 17 are manufactured using an additive manufacturing method, for example, using 3D printing. In particular, in the example embodiments shown in FIGS. 4 and 5, the carrier plate 3 is also manufactured using the additive manufacturing method at least in the regions of the conductor tracks 5 and cooling channels 7.

Figure 9:
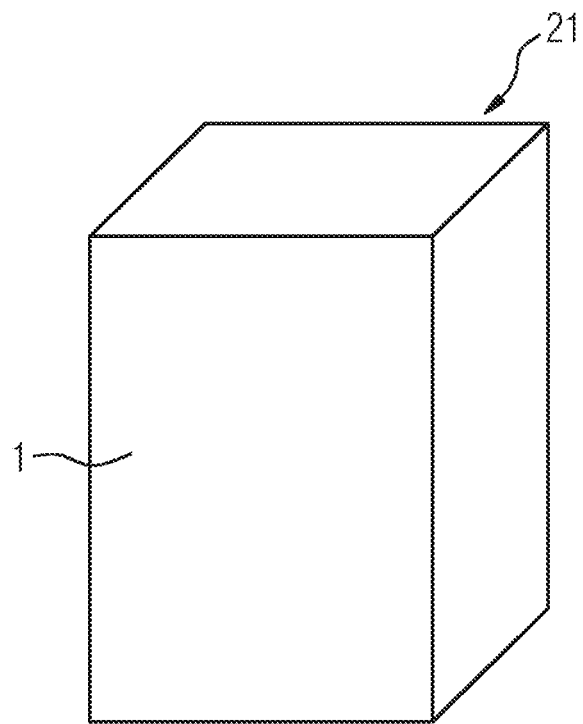
FIG. 9 shows a perspective view of a switch cabinet.

FIG. 9 shows a perspective view of a switch cabinet 21. The switch cabinet 21 has a backplane 1, as in one of the example embodiments described above, which forms a rear wall of the switch cabinet 21.

Although the invention has been illustrated and described in more detail by preferred example embodiments, the invention is not limited by the disclosed examples and other variations may be derived therefrom by a person skilled in the art without departing from the scope of the invention.

The invention claimed is:

1. A backplane for electrically connecting electrical components, the backplane comprising:
   a carrier plate;
   a plurality of conductor tracks, each respective conductor track of the plurality of conductor tracks extending at least one of,
      on the carrier plate,
      in the carrier plate;
   at least one cooling channel to conduct a cooling fluid, the at least one cooling channel arranged on at least one conductor track, of the plurality of conductor tracks, to cool the at least one conductor track; and
   wherein the at least one cooling channel at least partially surrounds the at least one conductor track.

2. The backplane of claim 1, wherein the at least one cooling channel is wound around the at least one conductor track.

3. The backplane of claim 1, wherein the at least one cooling channel includes a main channel and secondary channels, the secondary channels branching off from the main channel.

4. The backplane of claim 3, wherein the secondary channels extend around the at least one conductor track in a ring-like or finger-like manner.

5. The backplane of claim 1, wherein the at least one cooling channel includes at least two interconnected sub-channels, the at least two interconnected sub-channels being configured such that cooling fluid flows in opposite directions through respective ones of the at least two interconnected sub-channels.

6. The backplane of claim 1, wherein the at least one cooling channel is arranged on at least two of the plurality of the conductor tracks.

7. The backplane of claim 1, wherein the at least one cooling channel is a finned heat sink with cooling fins.

8. The backplane of claim 1, wherein a surface of the at least one conductor track is at least partially coated with an electrically insulating insulation layer.

9. A switch cabinet, comprising:
   a rear wall, the rear wall including, the backplane of claim 1.

10. A method for producing a backplane for electrically connecting electrical components, the backplane including a carrier plate, a plurality of conductor tracks, and at least one cooling channel to conduct a cooling fluid, wherein each respective conductor track of the plurality of conductor tracks extends at least one of on the carrier plate or in the carrier plate, the at least one cooling channel is arranged on at least one conductor track, of the plurality of conductor tracks, to cool the at least one conductor track, and the at least one cooling channel at least partially surrounds the at least one conductor track, the method comprising:

manufacturing the plurality of conductor tracks of the backplane and the at least one cooling channel of the backplane using an additive manufacturing method.

11. The method of claim 10, wherein the additive manufacturing method is a 3D printing method.

12. The method of claim 11, wherein the carrier plate is manufactured using the additive manufacturing method, at least in regions of the plurality of conductor tracks and in regions of the at least one cooling channel.

13. The method of claim 10, wherein the carrier plate is manufactured using the additive manufacturing method, at least in regions of the plurality of conductor tracks and in regions of the at least one cooling channel.

14. A backplane for electrically connecting electrical components, the backplane comprising:
   a carrier plate;
   a plurality of conductor tracks, each respective conductor track of the plurality of conductor tracks extending at least one of,
      on the carrier plate, or
      in the carrier plate; and
   at least one cooling channel to conduct a cooling fluid, the at least one cooling channel arranged on at least one conductor track, of the plurality of conductor tracks, to cool the at least one conductor track, the at least one cooling channel including a finned heat sink with cooling fins.

* * * * *